US006303045B1

United States Patent
Bullock

(10) Patent No.: US 6,303,045 B1
(45) Date of Patent: Oct. 16, 2001

(54) METHODS AND APPARATUS FOR ETCHING A NITRIDE LAYER IN A VARIABLE-GAP PLASMA PROCESSING CHAMBER

(75) Inventor: David M. Bullock, Highland Village, TX (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 08/822,335

(22) Filed: Mar. 20, 1997

(51) Int. Cl.[7] ................................................. C03C 15/00
(52) U.S. Cl. ................................................. 216/71; 216/79
(58) Field of Search .................................... 438/719, 723, 438/724, 720; 216/67

(56) References Cited

U.S. PATENT DOCUMENTS

| | | | |
|---|---|---|---|
| 4,181,564 | * | 1/1980 | Fogarty et al. ....................... 156/643 |
| 4,886,565 | * | 12/1989 | Koshiba et al. ....................... 156/345 |
| 5,203,958 | * | 4/1993 | Arai et al. ............................. 156/643 |
| 5,246,529 | * | 9/1993 | Fukasawa et al. .................... 156/643 |
| 5,269,879 | * | 12/1993 | Rhoades et al. ...................... 156/643 |
| 5,272,417 | * | 12/1993 | Ohmi ............................... 315/111.21 |
| 5,312,518 | * | 5/1994 | Kadomura ............................ 156/662 |
| 5,314,575 | * | 5/1994 | Yanagida .............................. 156/651 |
| 5,348,616 | * | 9/1994 | Hartman et al. ...................... 156/643 |
| 5,356,515 | * | 10/1994 | Tahara et al. ......................... 156/643 |
| 5,380,397 | * | 1/1995 | Fukuyama ............................ 156/643 |
| 5,429,070 | * | 7/1995 | Campbell et al. .................... 118/723 |
| 5,433,823 | * | 7/1995 | Cain ................................... 156/622.1 |
| 5,511,509 | * | 4/1996 | Shih .................................... 117/200 |
| 5,556,501 | * | 9/1996 | Collins et al. ........................ 156/345 |
| 5,632,855 | * | 5/1997 | Jones et al. ........................... 438/714 |

\* cited by examiner

Primary Examiner—Randy Gulakowski
Assistant Examiner—Allan Olsen
(74) Attorney, Agent, or Firm—Beyer Weaver Thomas & Nguyen, LLP

(57) ABSTRACT

A method for reducing gap-drive wear while employing a variable-gap plasma processing chamber for etching at least partially through a $Si_3N_4$ layer disposed on a substrate. The method includes introducing the substrate into the variable-gap plasma processing chamber while a gap between an upper surface of the substrate and an upper electrode of the variable-gap plasma processing chamber is maintained at a predefined gap distance. The method further includes flowing an etchant source gas comprising $CF_4$ and $O_2$ into the variable gap plasma processing chamber. There is further included etching the $Si_3N_4$ layer with a plasma struck from the etchant source gas while maintaining the gap at substantially the predefined gap distance.

7 Claims, 7 Drawing Sheets

METHODS AND APPARATUS FOR ETCHING A NITRIDE LAYER IN A VARIABLE-GAP PLASMA PROCESSING CHAMBER

BACKGROUND OF THE INVENTION

The present invention relates to the manufacture of semiconductor integrated circuits. More particularly, the present invention relates to improved techniques for performing a nitride ($Si_3N_4$) etch in a variable-gap plasma processing system, which advantageously improves substrate throughput while minimizing particulate defect density.

In the fabrication of semiconductor devices, e.g, semiconductor integrated circuits (ICs) or flat panel displays, devices such as component transistors are typically formed on a substrate, e.g. a silicon wafer or a glass panel. The etching of a nitride, or $Si_3N_4$ layer, is commonly performed in the manufacture of certain integrated circuit devices such as complementary metal oxide semiconductor (CMOS) transistors. Nitride layer etch, also known as well nitride etch or tank nitride etch in the case of CMOS transistors, is typically performed to define the n and p wells, for example.

To facilitate discussion, FIG. 1 depicts a simplified layer stack 100, representing the layers that may be formed above a semiconductor substrate during semiconductor IC fabrication. In FIG. 1 as well as the figures herein, it should be noted that the layers shown therein are illustrated only; other additional layers above, below, or between the layers shown may be present. Further, not all of the shown layers need necessarily be present and some or all may be substituted by other different layers using knowledge commonly possessed by those skilled in the art.

Layer stack 100 generally includes a substrate 102, which is typically formed of silicon. Above substrate 102, there may be disposed an oxide layer ($SiO_2$) layer 104. A nitride ($Si_3N_4$) layer 106 is shown disposed above oxide layer 104. To etch a desired pattern in nitride layer 106, an overlaying photoresist (PR) layer 108 is then formed atop the blanket deposited nitride layer 106. Photoresist layer 108 may then be patterned (e.g., through a conventional photoresist technique) to facilitate the etching of the underlaying nitride layer 106. By way of example, one such photoresist technique involves the patterning of photoresist layer 108 by exposing the photoresist material in a contact or stepper lithography system, and the development of the photoresist material to form a mask to facilitate subsequent etching. Using an appropriate etchant, the areas of nitride layer 106 that are unprotected by the photoresist mask are then etched away, leaving behind a desired pattern on nitride layer 106.

In the prior art, the etchant employed to etch through nitride layer 106 is typically a mixture comprising $SF_6$ and helium. When excited into a plasma (e.g., by radio frequency or RF energy), the fluorine species of the plasma etch through the unprotected areas of nitride layer 106 to form silicon fluoride, which is then evacuated away. The helium component in the prior art $SF_6$/helium chemistry is employed typically to assist in the distribution of the plasma etchant throughout the substrate, thereby improving uniformity. Further, helium may also help in cooling the substrate during etching in order to, for example, prevent the protective photoresist features from burning up.

It has been found, however, that the use of prior art $SF_6$/helium chemistry for etching nitride layer 106 typically requires a fairly narrow gap between the top surface of the substrate and the top electrode of the plasma processing chamber. When the prior art $SF_6$/helium chemistry is employed, the narrow gap is required to ensure an acceptable etch result. However, the requirement of a narrow gap has several disadvantages.

To facilitate discussion, FIG. 2 depicts a typical plasma processing chamber 200, representing a plasma processing chamber typically employed in the prior art to etch through the nitride layer. In the present example, plasma processing chamber 200 represents a plasma processing chamber of a plasma processing system known by the brandname of RAINBOW 4400™, which is available from Lam Research Corporation of Fremont, Calif. Although the RAINBOW 4400™ is employed herein to facilitate discussion, it should be borne in mind that the technique disclosed herein is not limited to this particular configuration; the inventive and disclosed nitride etch technique may be adapted, using knowledge commonly possessed by those skilled in the art, to other plasma processing chamber configurations.

Plasma processing chamber 200 typically includes a lower electrode or chuck 202, which is typically grounded. Substrate 204, representing a substrate having thereon a nitride layer to be etched, is typically disposed above lower electrode 202 during etching.

An upper electrode 206 is disposed above substrate 204 and is separated therefrom by a gap 208. Upper electrode 206 is mounted to a movable backing plate 210, typically in the form of a large circular metal disk. Movable backing plate 210 and upper electrode 206 may be moved along the direction of the z axis by a gap drive assembly which includes a plurality of lead screws 212, a chain 214, and a gap drive motor 216. By changing the direction of rotation of gap drive motor 216, movable backing plate 210 and upper electrode 206 may be moved toward or away from electrode 202, thereby varying the size of gap 208.

During the etch, the pressure within plasma processing chamber 202 is typically maintained at a lower pressure than the ambient environment pressure. In one embodiment, the nitride etch is carried out at a chamber pressure of about 500 milliTorr (mTorr). To maintain the pressure differential between the interior of plasma processing chamber 200 and the ambient pressure, seals 220 are typically provided around the periphery of movable backing plate 210. Seals 220, of which there are two in FIG. 2, are typically formed of a relatively non-reactive sealing material such as a suitable rubber, e.g., VITON™ rubber. To reduce friction between seals 220 and the interior surface of chamber wall 224 as backing plate 210 is moved toward or away from the substrate, seals 220 are typically lubricated with a suitable lubricant.

To facilitate etching, an etchant source gas rapture, e.g., $SF_6$/helium in the case of the prior art nitride etch, is typically flowed into chamber interior 226. In the configuration of FIG. 2, upper electrode 206 has a showerhead configuration, i.e., upper electrode 206 is provided with a plurality of apertures for releasing etchant source gases into chamber interior 226. However, the etchant source gases may also be provided through other mechanisms, e.g., via apertures in chamber wall 224 or a gas ring surrounding lower electrode 202.

An RF power source 228 is then turned on to provide RF energy to upper electrode 206. RF power source 228 is typically coupled to upper electrode 206 via an RF timing network 230 of a conventional design. RF tuning network 230 functions to minimize the impedance between RF power source 228 and plasma processing chamber 200, thereby maximizing power delivery. The supplied RF power ignites or strikes the plasma from the supplied etchant source gases within chamber interior 226 to etch the unprotected areas of the nitride layer. Reaction byproduct gasses are then exhausted away through an exhaust port 240. Exhaust port 240 may be coupled to an automatic pressure control (APC) system 242, which automatically varies the rate of the gas exhausted through exhaust port 240 to maintain the desired chamber interior pressure.

As mentioned earlier, the prior art $SF_6$/helium chemistry, which is employed to etch the nitride layer, typically requires a fairly narrow gap 208, e.g., between 0.8 cm to 1.2 cm, to achieve an acceptable etch result. This gap clearance is typically insufficient to ensure proper loading and unloading of substrate 204. By way of example the robotic arm that is typically employed to move substrate 204 from load lock 244 into chamber interior 226 and to position substrate 204 on a lower electrode 202 typically requires a gap clearance greater than the aforementioned gap distance of 0.8 cm to 1.2 cm. Likewise, when etching is completed and substrate 204 is lifted off lower electrode 202 (employing for example, lifter pin 246), a gap clearance greater than the abovementioned 0.8 cm to 1.2 cm must be provided to permit the robot arm to move the etched substrate from chamber interior 226 into load lock 244.

To provide the required gap clearance for proper loading and unloading, the prior art nitride etch technique requires that movable backing plate 210 (and upper electrode 206) be moved away from lower electrode 202 during the loading of substrate 204. Gap drive motor 216 then engages to lower movable backing plate 210 (and upper electrode 206) toward substrate 204, thereby maintaining a proper gap 208 between the lower surface of upper electrode 206 and the upper surface of substrate 204 to facilitate nitride etching. When the etch is completed, gap drive motor 216 then engages to raise movable backing plate 210 (and upper electrode 206) away from substrate 204 to facilitate the unloading of the substrate from chamber interior 226.

Through experience, it has been found, however, that the moving of movable backing plate 210 creates many disadvantages. By way of example, because of the pressure differential between chamber interior 226 and the ambient pressure, a large amount of stress is typically imposed on the gap drive assembly (e.g., on lead screws 212, chain 214, and/or gap drive motor 216), whenever gap drive motor 216 is engaged to move movable backing plate 210 toward or away from substrate 204. Accordingly, the gap drive assembly has been found to be susceptible to a high degree of wear and frequent failures, necessitating the temporary cessation of the etching operation for maintenance and/or replacement. The high frequency of maintenance and/or repair reduces the throughput of the plasma processing system, i.e., reduces the number of substrates that can be etched over a given period of time, thereby increasing the plasma processing system's overall cost of ownership.

Further, it has been found that rubber seals 220 degrade over time as they are moved. When seals 220 wear away, some of the seal material, e.g., rubber particles, ay be introduced into chamber interior 226, thereby increasing the level of particulate contaminants within chamber interior 226, and the defect density in the resulting semiconductor device. Further, worn seals may cause atmospheric leaks, which introduce unwanted ambient air into chamber interior 226 during the etch process, leading to etch defects.

Still further, the seal lubrication material employed to reduce friction between seals 220 and chamber wall 224 when movable backing plate 210 slides along the chamber wall may age over time, causing lubrication particles to flake off into chamber interior 226, further increasing the level of particulate contamination therein and increasing the defect density in the etched semiconductor devices.

Some modern fixed gap plasma processing systems, e.g., TCP™ brand, systems also available from the aforementioned Lam Research Corporation, do not have a movable upper electrode and consequently do not suffer the aforementioned gap-drive related contamination and maintenance problems. Despite the disadvantages associated with nitride etching in variable-gap plasma processing systems, some semiconductor manufacturer have nevertheless found themselves in a situation wherein a large amount of capital has already been expended to acquire variable-gap plasma processing systems. The capital investment in variable-gap plasma processing systems requires that the use of variable-gap plasma processing systems continue to justify their acquisition costs, at least until the acquisition costs are recouped.

To reduce the frequency of maintenance and/or repair as well as the possibility of unwanted particulate contamination within chamber interior 226, there have been attempts at formulating a nitride etch process wherein gap 208 can be fixed (i.e., movable backing plate 210 does not have to be moved) during the loading of substrate 204, the plasma etching of the nitride layer disposed thereon, and the unloading of substrate 204 after etching. However, these attempts have largely been unsatisfactory.

In particular, it has been found that most chemistries commonly employed for performing the nitride etch do not yield satisfactory etch results when gap 208 is fixed at a gap distance suitable for loading and unloading of substrate 204. Further, when gap 208 is enlarged, the volume of chamber interior 226 correspondingly increases, which complicates pressure stability issues during etching. By way of example, it has been found that the large volume of chamber interior 226, which is caused by increasing gap 208, makes it difficult and time-consuming to stabilize the pressure within chamber interior 226 prior to etching.

Stabilization refers to the step taken prior to etching to ensure that the desired process parameters are stable. In general, the processed parameters such as pressure, etchant gas flow rate, temperature, and the like within chamber interior 226, must be substantially stabilized before etching can begin. This is because the values of these parameters within chamber interior 226 may fluctuate initially, e.g., when etchant source gasses are initially flowed into chamber interior 226 and RF power source 228 is initially turned on. If etching is conducted while the process parameters fluctuate, the etch results, e.g., uniformity, etch rate, selectivity, and the like, may be unpredictable and/or other than desired.

As can be appreciated by those skilled in the art, the duration of the stability step is preferably minimized to the maximum extent possible since no etching occurs during the stability step. Longer stability steps tend to reduce the substrate throughput, which lowers productivity and increases the cost of ownership of the plasma processing system.

It has been found, however, that with a larger gap dimension, prior art techniques of stabilizing the pressure chamber interior 226 typically result in an unacceptably time-consuming stability step. To facilitate discussion, FIG. 3 depicts two lines, 302 and 304 on a pressure versus time plot. Line 302 depicts the pressure within chamber interior 226 during a typical nitride etch process when the gap is relatively small, e.g., 1.2 cm in the case of the prior art $SF_6$/Helium chemistry. On the other hand, line 304 depicts the pressure within chamber interior 226 for a nitride etch process when gap 208 is increased.

At point 306 on the time scale, the stability step begins. At this point, the prior art typically stabilizes the pressure within chamber interior 226 at the process pressure set point, i.e., the pressure at which nitride etching is conducted (which may be 500 mT in one prior art example). As mentioned earlier, pressure within chamber interior 226 is regulated by withdrawing an appropriate amount of gas through exhaust port 240 (using automatic pressure control system 242).

At point 308, RF power source 228 is turned on. The introduction of RF power excites the gas within chamber interior 226, causing the pressure therein to increase. Pressure increases to point 310, causing automatic pressure control system 242 to engage to compensate and bring pressure down to the process pressure set point of 500 mT. The pressure within chamber interior 226 stabilizes at the process pressure set point of 500 mT at point 312 in FIG. 3. Once stabilized, the etch may begin. At point 314, the etch is completed.

When gap 208 is increased, the larger volume of chamber interior 226 causes a greater amount of pressure increase when RF power supply 228 is turned on. Again, automatic pressure control system 242 engages at point 316 to compensate. However, the greater amount of pressure variation in chamber interior 226 due to a larger gap 208 lengthens the stability step. The pressure within chamber interior 226 does not stabilize at the process pressure set one of 500 milliTorr until point 318. Because the etch process does not begin until pressure is stabilized at the process pressure set point of 500 miiliTorrs, etching begins later with the etch process associated with line 304, compared with the etch process associated with line 302 (at point 318 which is later in time than point 312).

Because etching did not begin until point 318 on line 304, which is later in time than point 312 on line 302, it did not end until point 320 on line 304, which is later in time than point 314 on line 302. Accordingly, the etch process associated with a larger gap 208 takes longer from the moment the stabilize step begins until the time the etch ends (from point 306 to point 320 on the timeline). As shown in FIG. 3, this duration is clearly longer than the etch process associated with a narrow gap (associated with line 302), which begins at point 306 and ends at point 314.

To some semiconductor manufacturers, the increase in the time required for a nitride etch cycle due to an enlarged gap distance results in an unacceptably low substrate throughput (i.e., productivity), and an unacceptably high cost of ownership. Because of these hurdles, prior art attempts at fixed-gap nitride etching in variable-gap plasma processing systems, particularly when the prior art technique of stabilizing the process pressure is employed, has been found to be relatively unproductive.

In view of the foregoing, there are desired improved techniques for etching the nitride layer of a semiconductor substrate in a variable-gap plasma processing system The improved technique preferably permits the use of a fixed gap during the loading, etching, and unloading of the substrate in order to reduce the frequency of maintenance and/or repair, and the level of particulate contamination within the variable-gap chamber interior.

SUMMARY OF THE INVENTION

The invention relates, in one embodiment, to a method for reducing gap-drive wear while employing a variable-gap plasma processing chamber for etching at least partially through a $Si_3N_4$ layer disposed on a substrate. The method includes introducing the substrate into the variable-gap plasma processing chamber while a gap between an upper surface of the substrate and an upper electrode of the variable-gap plasma processing chamber is maintained at a predefined gap distance. The method further includes flowing an etchant source gas comprising $CF_4$ and $O_2$ into the variable gap plasma processing chamber. There is further included etching the $Si_3N_4$ layer with a plasma struck from the etchant source gas while maintaining the gap at substantially the predefined gap distance.

In another embodiment, the invention relates to a method for reducing gap-drive related contamination while employing a variable-gap plasma processing chamber for etching at least partially through a $Si_3N_4$ layer disposed on a substrate. The gap-drive related contamination is one of a particulate contamination and an environmental leak contamination. The method includes introducing the substrate into the variable-gap plasma processing chamber while a gap between an upper surface of the substrate and an upper electrode of the variable-gap plasma processing chamber is maintained at a predefined gap distance. The method further includes flowing an etchant source gas comprising $CF_4$ and $O_2$ into the variable gap plasma processing chamber. There is further included etching the $Si_3N_4$ layer with a plasma struck from the etchant source gas while maintaining the gap at substantially the predefined gap distance.

In yet another embodiment, the invention relates to a method for etching at least partially through a $Si_3N_4$ layer disposed on a substrate in a variable-gap plasma processing chamber without varying a gap between an upper surface of the substrate and an upper electrode of the variable-gap plasma processing chamber. The method includes introducing the substrate into the variable-gap plasma processing chamber while the gap is maintained at a predefined gap distance. The method further includes flowing an etchant source gas comprising $CF_4$ and $O_2$ into the variable gap plasma processing chamber. The method also includes striking a plasma from the etchant source gas using an RF power source. Additionally, there is included stabilizing a chamber pressure within the variable-gap plasma processing chamber to a predefined process pressure set point after the striking. There is also included etching the $Si_3N_4$ layer with a plasma struck from the etchant source gas after the stabilizing while maintaining the gap at substantially the predefined gap distance. The method also includes removing the substrate from the variable-gap plasma processing chamber after the etching without varying the gap.

These and other advantages of the present invention will become apparent upon reading the following detailed descriptions and studying the various drawings.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

In accordance with one aspect of the present invention, the above-mentioned gap drive-related maintenance and contamination problems are advantageously alleviated through the use of $CF_4/O_2$ etchant source gasses, which advantageously yield satisfactory etch results when nitride etching is conducted at a wide gap 208. The use of $CF_4/O_2$ at a wide gap 208 permits the gap to be fixed while loading the substrate into the chamber interior, performing plasma etching on the nitride layer, and unloading the substrate from the chamber interior.

Because the entire loading, etching, and unloading sequence may be performed at a fixed gap, there is advantageously no need to employ the gap drive assembly to vary the gap between the upper electrode and the substrate. Advantageously, maintenance issues associated with employing the gap drive assembly to raise and lower the upper movable backing plate (and the upper electrode which is attached thereto) are substantially eliminated. Further, less wear is experienced by the rubber seals, thereby reducing the level of particulate contamination in the chamber interior due to the rubber particles and/or Lubrication film flaking In accordance with one aspect of the present invention, there are provided ovel and non-obvious pressure stability techniques which advantageously minimize he time required to stabilize the chamber interior pressure to the desired process pressure set point. The inventive pressure stabilization techniques advantageously shorten the duration of the stabilized step prior to etching, concomitantly reducing the duration of each etch cycle, thereby improving substrate throughput and productivity.

Figure 4:
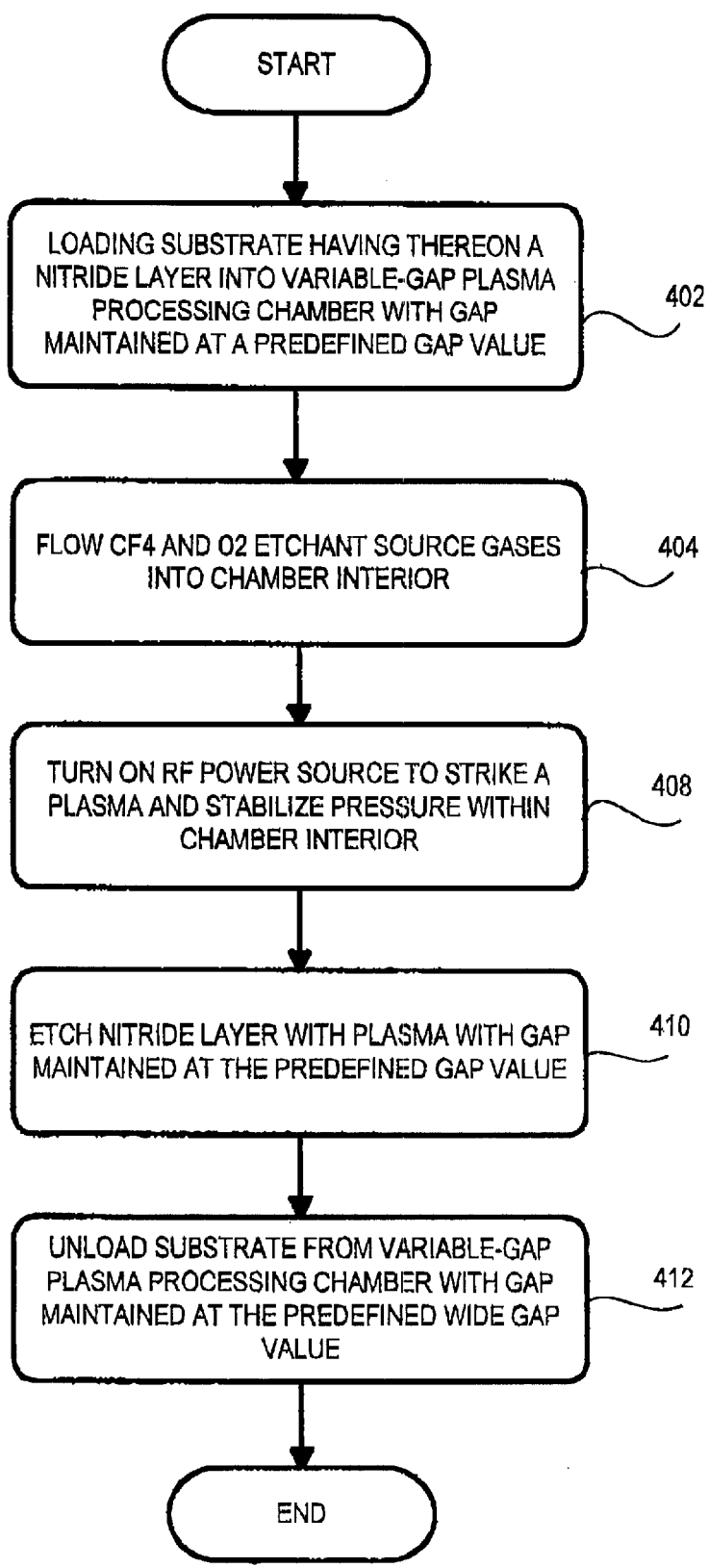
FIG. 4 illustrates, in accordance with one aspect of the present invention, the steps involved in performing the fixed-gap $CF_4/O_2$ nitride etch technique.

To further illustrate the advantages and features of the present invention, FIG. 4 illustrates, in accordance with one aspect of the present invention, the steps involved in performing the fixed-gap $CF_4/O_2$ nitride etch technique. In the preferred embodiment, the variable-gap plasma processing chamber represents one wherein electrodes of parallel-plate types are employed to produce the plasma for etching. It should be emphasized again that although the RAINBOW 4400™ brand plasma processing system by Lam Research Corporation is employed in this disclosure to illustrate, in accordance with one embodiment of the present invention, the inventive fixed-gap $CF_4/O_2$ nitride etch technique, the disclosed fixed-gap nitride technique may be adapted to other plasma processing chamber configurations using knowledge commonly possessed by those skilled in the art in view of this disclosure.

Figure 1:
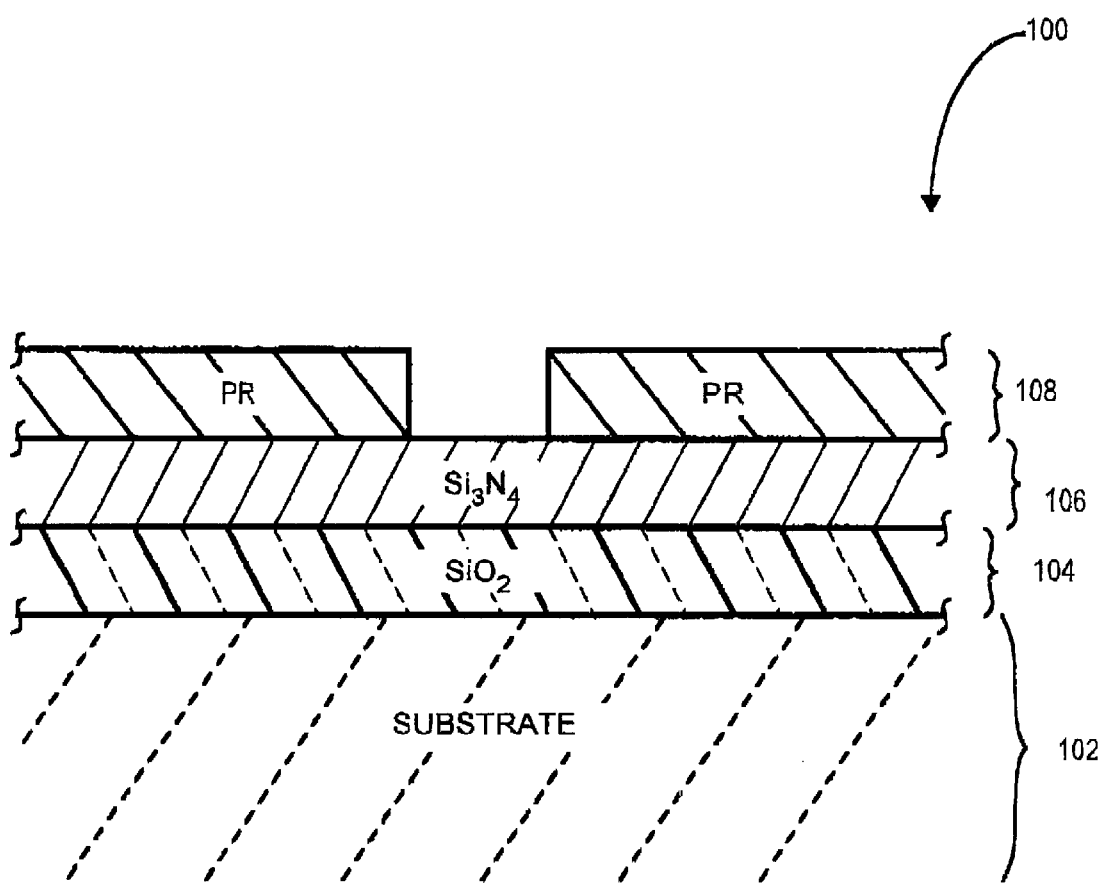
FIG. 1 depicts a simplified layer stack, representing the layers that may be formed above a semiconductor substrate during semiconductor IC fabrication.
Figure 2:
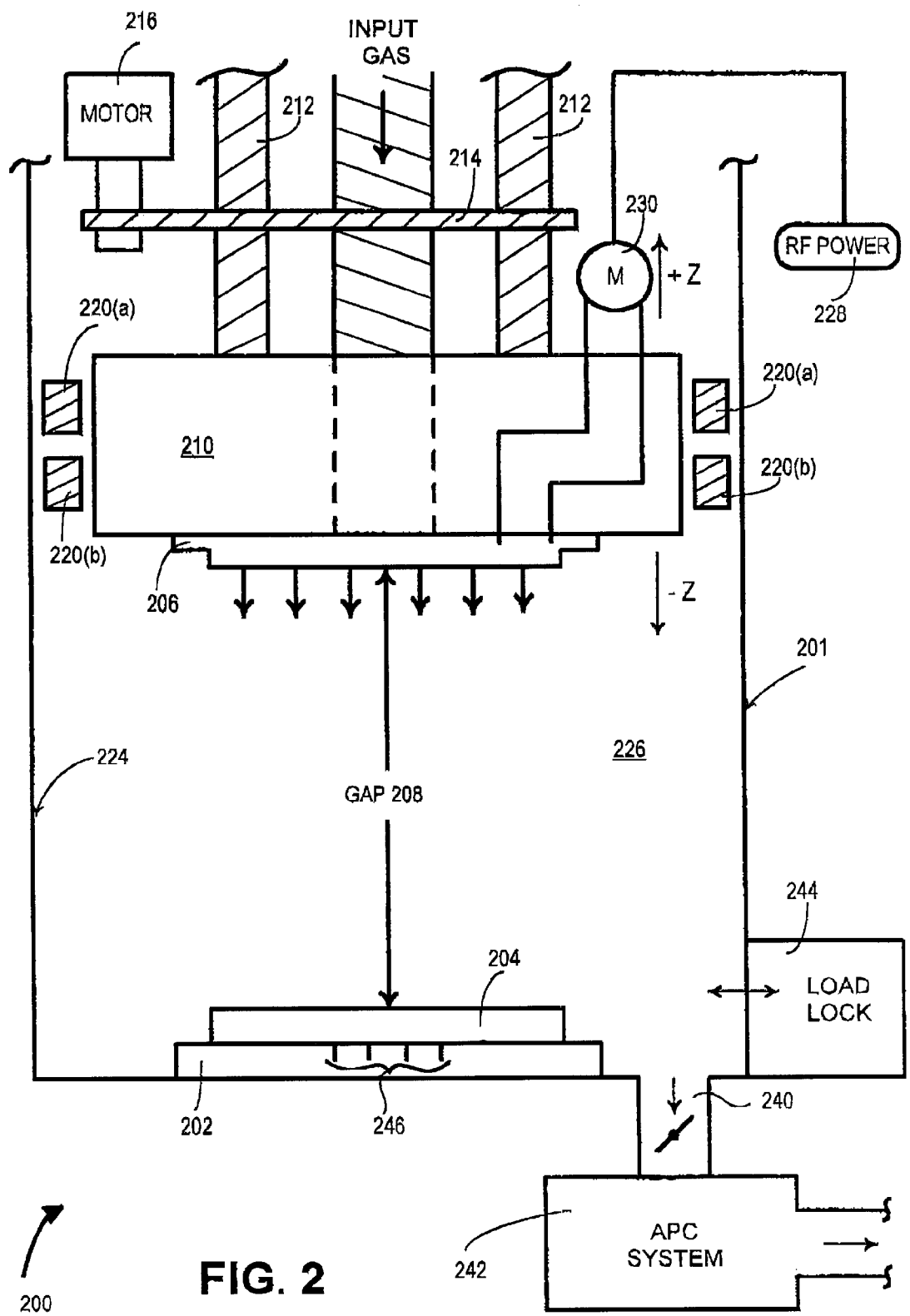
FIG. 2 depicts a typical variable-gap plasma processing chamber, representing a plasma processing chamber typically employed in the prior art to etch through the nitride layer.

In step 402, a substrate having thereon a -nitride ($Si_3N_4$) layer is introduced or loaded into a variable-gap plasma processing chamber with the gap between the upper surface of the substrate (after being disposed above the lower electrode) and the lower surface of the upper electrode maintained at a predefined gap value. With reference to FIG. 2, gap 208 between the upper surface of substrate 204 and the lower surface of upper electrode 206 is maintained at the aforementioned predefined gap value. Preferably, this predefined gap value represents the default gap value of the variable-gap plasma processing chamber. In the case of the RAINBOW 4400™ brand plasma processing system variable-gap plasma processing chamber, the predefined gap value is about 5 cm, more preferably, at about 5.5 cm, and preferably, at about 5.53 cm. In one embodiment, the above predefined gap value works well for etching a 200 mm wafer in a RAINBOW 4400™ brand plasma processing system variable-gap plasma processing chamber.

In step 404, etchant source gasses which include $CF_4$ and $O_2$ are flowed into the chamber interior of the variable-gap plasma processing chamber. In step 408, the RF power source is turned on to supply RF energy to the upper electrode, thereby sticking a plasma with the $CF_{4/2}$ etchant source gasses. The pressure within the chamber interior is stabilized (also in step 408) after the RF power is turned on. This pressure stabilizing step involves, in one embodiment, novel and non-obvious pressure stabilization techniques, which are discussed in greater detail in FIGS. 5 and 6 herein.

In step 410, the nitride layer, which is disposed above the substrate introduced into the chamber interior in step 402, is etched with the $CF_4/O_2$ plasma while the gap is maintained substantially at the aforementioned predefined gap value. In other words, the gap is fixed and the gap drive assembly is preferably not employed to vary the gap between the upper electrode and the substrate between the time the substrate is introduced into the chamber interior and the time the plasma etching step begins. Advantageously, fixed-gap nitride etch is achieved even in parallel plate-type variable-gap plasma processing chambers.

In step 412, the substrate is unloaded from the variable-gap plasma processing chamber after etching is completed without varying the gap. In other words, the gap drive mechanism is preferably not employed to vary the gap between the upper electrode and the substrate throughout the sequence of loading the substrate into the chamber interior, plasma etching of the nitrite layer, and unloading the substrate from the plasma processing chamber. Since the movable backing plate (and seals) do not move relative to the chamber walls, contamination and reliability problems associated with varying the gap, which have been discussed in detail earlier, are substantially eliminated.

In the following paragraphs, approximate ranges of process parameters suitable for performing the fixed-gap $CF_4/O_2$ nitride etch technique in a variable-gap plasma processing chamber are disclosed. Although the suitable ranges are disclosed herein below in connection with 200 mm wafers in a RAINBOW 4400™ brand plasma processing system variable-gap plasma processing system these ranges should serve as guidelines to enable one skilled in the art to adapt the disclosed etch technique to wafers having other dimensions and/or employing other variable-gap plasma processing systems.

For a 200 mm wafer etched in a variable-gap plasma processing chamber such as the RAINBOW 4400™ brand plasma process using the $CF_4/O_2$ chemistry, the flow ratio of the $CF_4$ etchant source gas to the $O_2$ etchant source gas may be about 9:1. The $CF_4$ flow in standard cubic centimeters per minute (sccm) is between about 60 sccm and about 140 sccm, more preferably, between about 80 sccm and about 120 sccm, and preferably, at about 100 sccm. The oxygen flow is between about 6 sccm and about 14 sccm, more preferably, between about 8 sccm and about 12 sccm, and preferably, at about 10 sccm. Pressure in milliTorr (mT) is maintained within the chamber interior (e.g., chamber interior 226 of FIG. 2) between about 400 mT and about 600 mT, more preferably, between 450 mT and about 550 mT, and preferably, at about 500 mT. The etch pressure may be varied as needed to achieve the desired etch uniformity. RF power in watts (W) is supplied to the upper electrodes (e.g., upper electrode 206) at between about 180 W to about 420 W, more preferably, between 240 W to about 360 W, and preferably at about 300 W.

The upper electrode temperature is maintained at about 40° C. in one example. The temperature of the lower electrode is maintained at about 40° C. in one embodiment. In one embodiment, the top electrode and/or bottom electrode are heated and/or cooled by a liquid effluent (using for example, automatic temperature control circuitries). The temperature of the chamber walls (for example chamber walls 224 of FIG. 2) may be maintained at about 60° C. In one embodiment, the temperature of the chamber wall is maintained using a common resistive heater.

As mentioned earlier, the invention provides, in accordance with one aspect of the present invention, novel and non-obvious pressure compensation techniques to minimize the duration of the stabilization step. As mentioned earlier, reducing the duration of the pressure stabilization step advantageously reduces the total duration of an etch cycle, thereby increasing substrate throughput and productivity.

Figure 5:
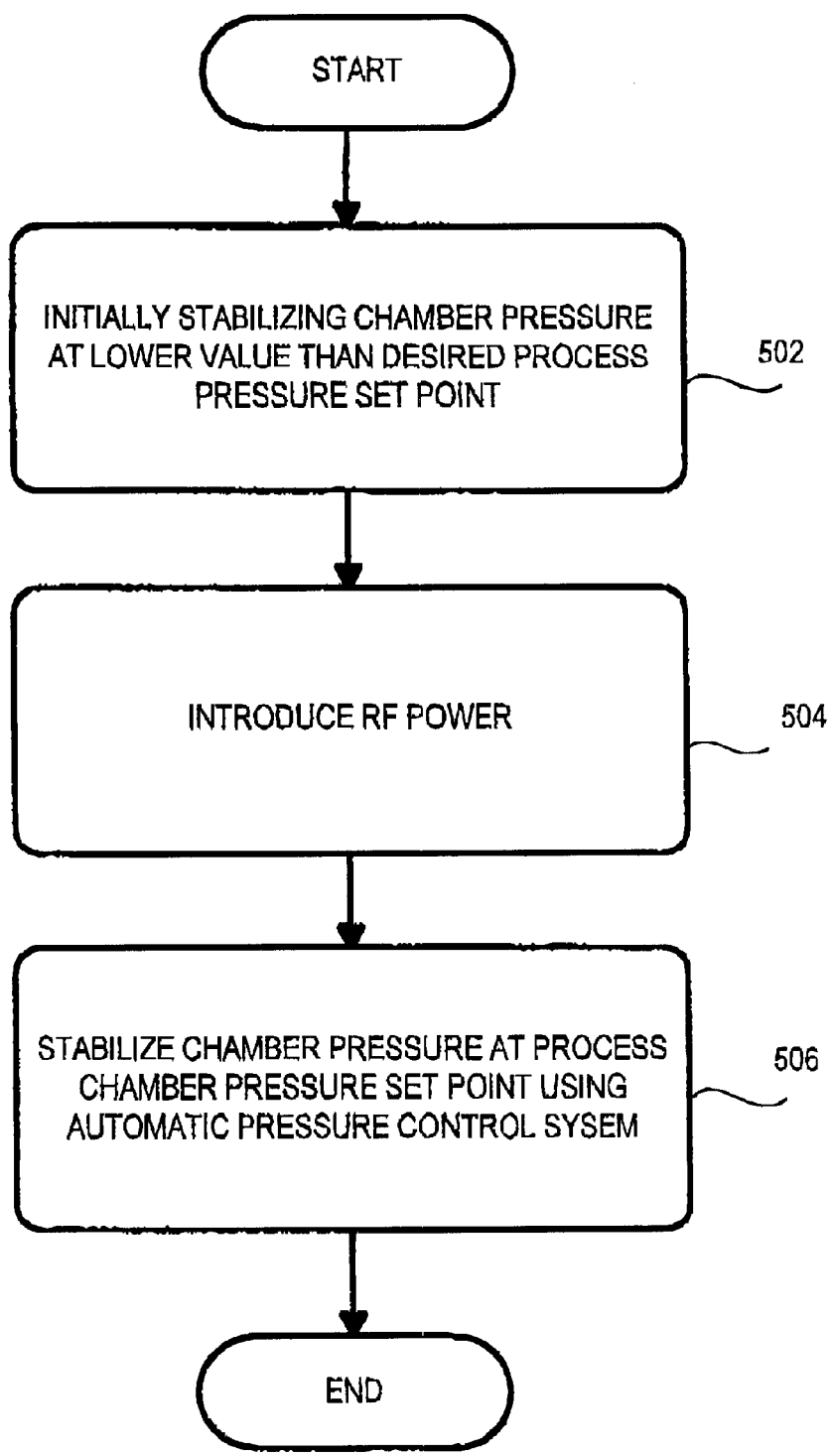
FIG. 5 is a flowchart illustrating, in accordance with one aspect of the present invention, the steps involved in the stabilizing pressure step of FIG. 4.

FIG. 5 is a flowchart illustrating, in accordance with one aspect of the present invention, the steps involved in the stabilizing pressure step 408 of FIG. 4. In step 502, he pressure set point for the pressure within the chamber interior is initially set to be lower than the desired process set point. By way of example, if the desired process pressure set point is about 500 mT during plasma etching of the nitride layer, the pressure within the chamber interior is initially stabilized at a lower value, e.g., about 100 mT lower or at about 400 mT. The initial stabilization of the pressure within the chamber interior (e.g., chamber interior 226) may be accomplished by dialing in the lower pressure value into the automatic pressure control system (e.g., APC system 242 of FIG. 2) so that a lower initial chamber interior pressure is achieved.

In step 504, the RF power source is turned on to strike a plasma with the etchant source gasses within the chamber interior. As expected, the introduction of RF energy excites the etchant source gas molecules and causes pressure within the chamber interior to increase. In step 506, a chamber pressure within the chamber interior is stabilized at the process pressure set point, e.g., using the aforementioned automatic pressure control system.

Figure 6:
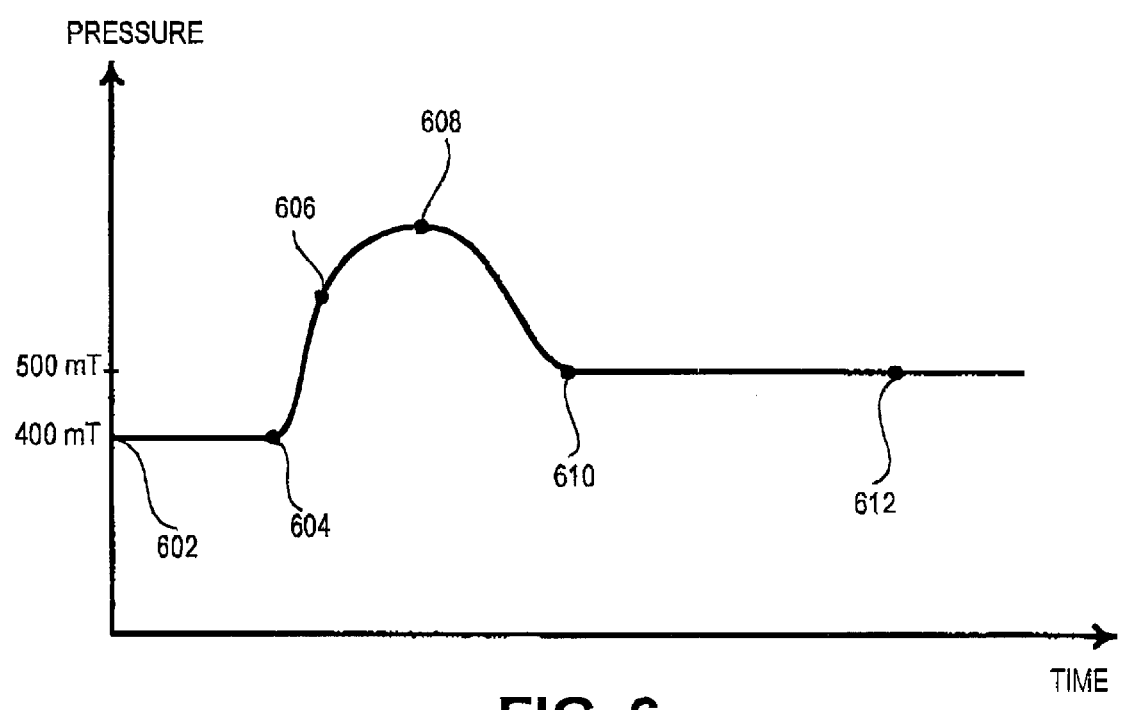
FIG. 6 illustrates, in accordance with one embodiment of the present invention, the pressure versus time plot for a nitride etch process which employs the pressure stabilization technique of FIG. 5.

The advantages associated with the inventive pressure stabilization technique of FIG. 5 may be better understood with reference to FIG. 6. FIG. 6 illustrates, in accordance with one embodiment of the present invention, the pressure versus time plot for a nitride etch process which employs the pressure stabilization technique of FIG. 5. In FIG. 6, the desired process pressure set point, i.e., the chamber pressure at which plasma etching is conducted, is about 500 mT.

In step 502, the chamber pressure is initially stabilized at a lower pressure, e.g., 400 mT, at point 602. At point 604, the RF power is turned on as discussed earlier in connection with step 504 of FIG. 5. RF excitation causes the pressure within the chamber interior to increase and the automatic pressure control system begins to compensate at about point 606 of the plot. At about point 608, the chamber pressure peaks out and begins to settle down towards the desired process pressure set point. At point 610, the chamber interior pressure reaches the desired process pressure set point (500 mT in this example), and etching begins. The plasma etched step ends at point 612.

Figure 3:
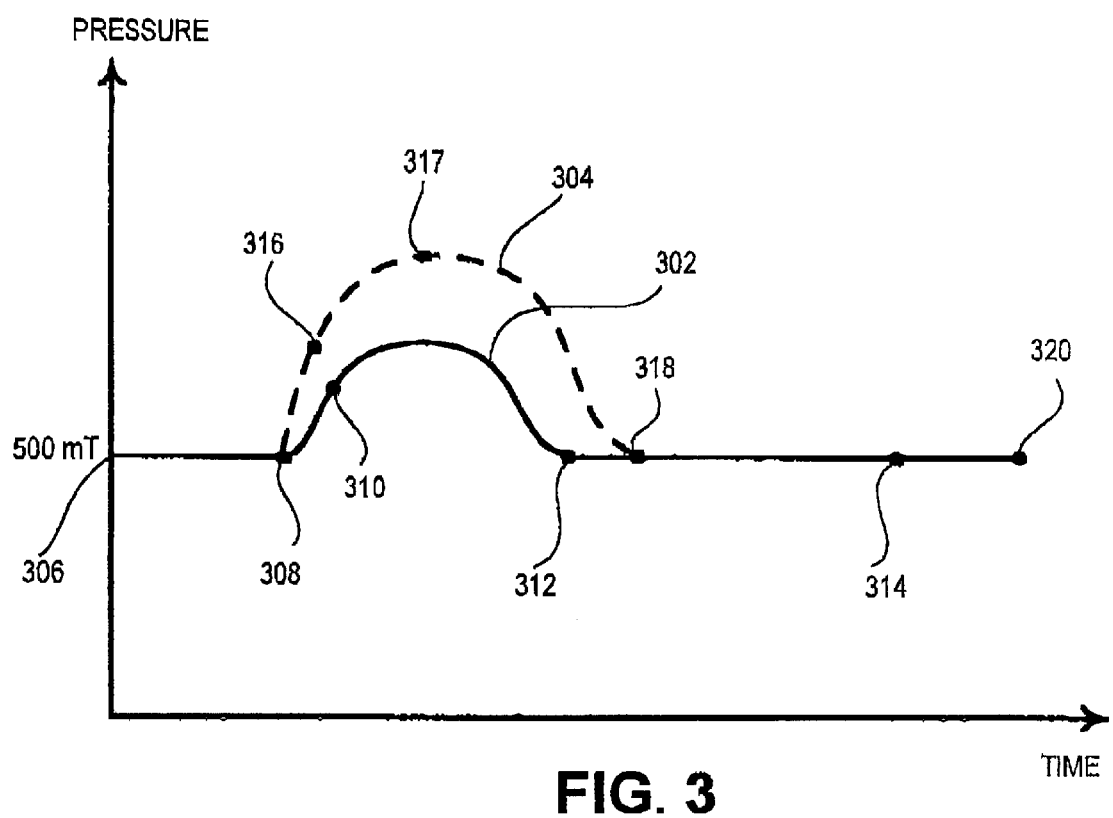
FIG. 3 depicts on a pressure versus time plot the pressure within the plasma processing chamber when the RF power is turned on for various gap sizes.

Note that since pressure is initially stabilized at a lower pressure than the desired process pressure set point, the chamber pressure peaks at a lower value (at point 608 on the pressure scale). Advantageously, the difference in pressure between this peak point 608 and the desired process pressure (at point 610), is smaller than the difference shown by line 304 of FIG. 3. Advantageously, the time required to lower the chamber interior pressure from point 608 to point 610 is shorter, thereby advantageously shortens the stabilization step (between point 602 and point 610), which shortens the overall duration of the etch cycle (between point 602 and point 612 on the time scale).

Although the chamber interior is stabilized in the example of FIG. 6 at about 100 mT below the desired process pressure set point, the invention is not so limiting. The value (from the desired process pressure set point) by which the chamber interior pressure is lowered during the initial stabilization step 502 may be varied to suit the requirements of a particular process and the response characteristics of the automatic pressure control system In general, as the desired process pressure set point is decreased, this value tends to be smaller.

In another embodiment, the pressure within the chamber interior may be stabilized by initially stabilizing the pressure at the desired process pressure set point, albeit at a higher gas flow than the desired gas flow set point. For example, if the desired total gas flow of $CF_4/O_2$ into chamber interior 226 is 110 sccm and the desired process pressure set point is about 500 mT, the chamber interior may be stabilized initially at about 500 mT, albeit at an elevated rate of gas flow, e.g., 120 sccm of $CF_4$ and $O_2$. In one embodiment, the flow of $CF_4$ and $O_2$ may be increased proportionally to maintain the same ratio between these two gasses as the ratio employed during the etch step.

Figure 7:
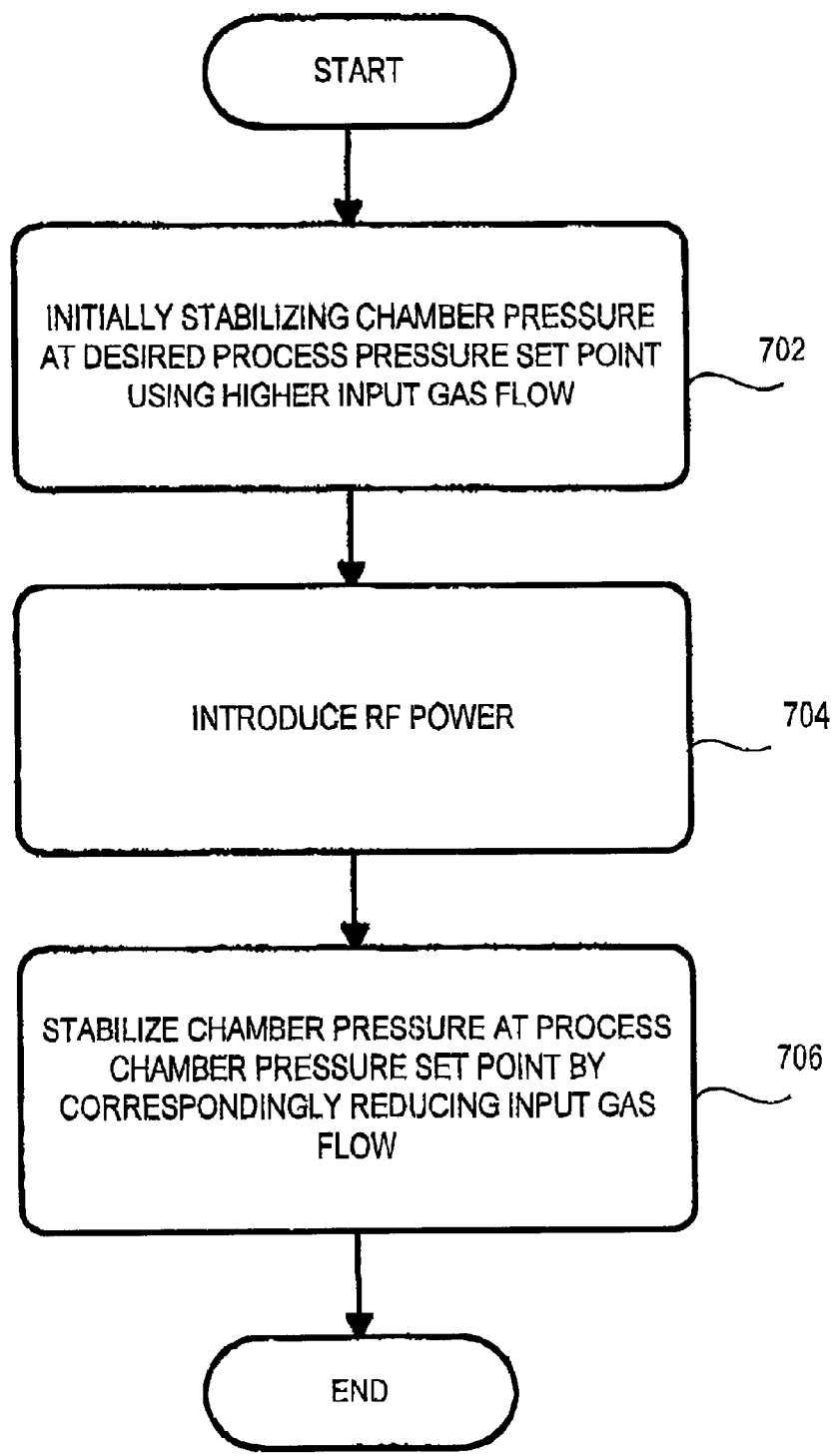
FIG. 7 illustrates, in accordance with one embodiment of the present invention, the steps involved in stabilizing the pressure wherein the chamber pressure is initially stabilized at the desired process pressure set point, albeit with a greater rate of gas flow.

After RF power is introduced and the pressure within the chamber interior begins to increase, the gas flow into the chamber interior may be correspondingly reduced to keep the chamber interior pressure stable at the desired process pressure set point. FIG. 7 illustrates this embodiment wherein the chamber pressure is initially stabilized at the desired process pressure set point, albeit with a greater rate of gas flow. Step 704 represents the step wherein the RF power is introduced to strike a plasma from the etchant source gas. In step 706, the gas flow is reduced correspondingly to maintain the chamber interior pressure at the desired process pressure set point.

In some cases, the rate of gas flow of the etchant source gasses may be limited by the capacity of the mass flow controller (MFC). In these cases, it may not be possible to increase the rate of etchant source gas flow during step 702. In one embodiment, an inert gas such as helium may be employed to initially stabilize the chamber pressure with a higher rate of gas flow. As the pressure increases with the introduction of RF power, the flow rate of this additional gas (e.g., helium) may be reduced or shut off to continue maintaining the chamber interior pressure at the desired process pressure set point.

Figure 8:
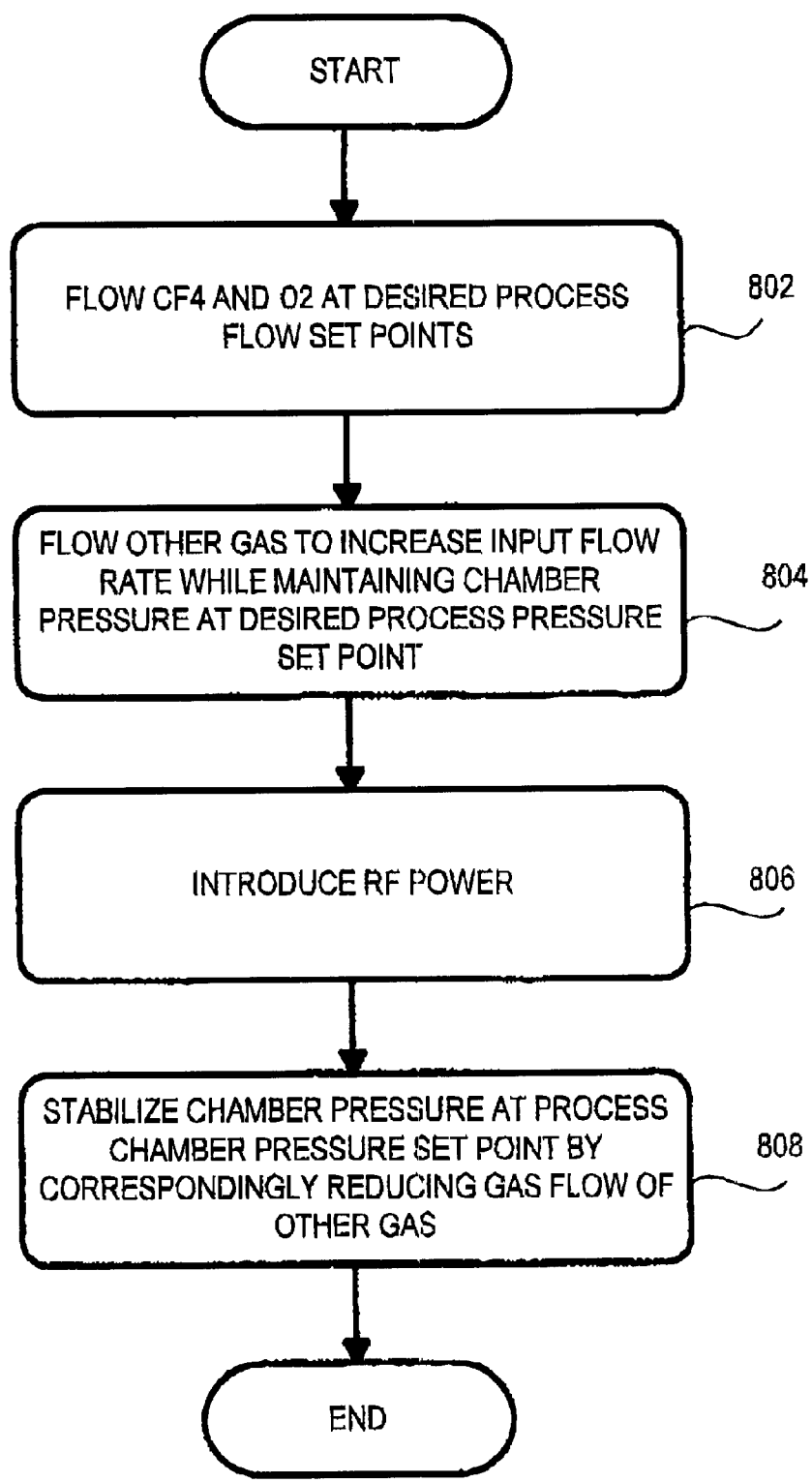
FIG. 8 illustrates, in accordance with one embodiment of the present invention, the steps involved in the stabilizing pressure step of FIG. 4 when an additional gas is employed to stabilize the chamber interior pressure.

FIG. 8 illustrates this embodiment wherein an additional gas is employed to stabilize the chamber interior pressure in accordance with one embodiment of the inventive pressure stabilzation technique. In step 802 the etchant source gases $CF_4$ and $O_2$ are flowed into the chamber interior at the process flow set point. In step 804, another gas (e.g., helium) is flowed into the chamber interior. The automatic pressure control system maintains the chamber interior pressure at the desired process pressure set point, albeit at a higher total flow rate. In step 806, RF power is introduced, which strikes a plasma from the etchant source gasses and causes the chamber interior pressure to increase. In step 808, the flow of the other gas (e.g., helium) is correspondingly reduced or shut off to maintain the chamber interior pressure at the desired process pressure set point.

The inventive fixed-gap $CF_4/O_2$ nitride etch technique, when employed in a variable-gap plasma processing chamber, advantageously yields satisfactory etch results. In one example, nitride etching of a 200 mm wafer in the aforementioned RAINBOW 4400™ brand plasma processing system yields a nitride etch rate of about 1600 angstroms per minute. The oxide etch rate, i.e., the rate at which the underlying oxide layer is etched, is found to be about 150 angstroms per minute, which results in a selectivity of nitride to oxide of about 11:1. Uniformity (one-δ) is found to be about 2.5%. This one-δ value may be based, for example, on 17 pre-etched measurements and 17 post-etched measurements taken at predefined locations on the wafer.

As can be appreciated from the foregoing, the inventive fixed-gap $CF_4/O_2$ nitride etch technique advantageously yields satisfactory etch results, which include a high nitride etch rate, acceptable uniformity, and high nitride to oxide selectivity, when employed in a variable-gap plasma processing chamber. The fact that the gap drive assembly of the variable-gap plasma processing chamber does not need to be engaged to vary the gap advantageously reduces stress on the gap drive assembly, which reduces the frequency of maintenance and/or repair, and increases the mean time between failures (MTBF). Consequently, the rate of substrate throughput is advantageously increased, thereby reducing the costs of ownership of the variable-gap plasma processing system.

Further, the inventive fixed-gap $CF_4/O_2$ nitride etch technique permits the movable backing plate and upper electrode of the variable-gap plasma processing chamber to be fixed at one location, advantageously reducing wear on the rubber seals that are disposed between the movable backing plate and the interior walls of the chamber (e.g., seals 220 of FIG. 2). As mentioned earlier, keeping seals 220 immobile relative to chamber walls 224 reduces wear on the seals, which in turn reduces particulate contamination from the worn seal material (e.g., rubber particles). The reduced level of wear of the seals (e.g., seal 220), also reduces the potentiality for atmosphere leaks, leading to a higher MTBF (Mean Time Between Failure) and lower overall cost of maintenance. Advantageously, the invention permits manufacturers to continue employing their variable-gap plasma processing systems, e.g., parallel-plates type variable-gap plasma processing systems, to etch through the nitride layer, thereby permitting semiconductor manufacturers to continue leveraging their investments in the variable-gap plasma processing systems, which may be quite expensive to acquire originally.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching at least partially through a layer disposed on a substrate, comprising:

introducing said substrate into a plasma processing chamber;

flowing an etchant source gas into the plasma processing chamber;

applying a first pressure set point to an automatic pressure control system to control the chamber pressure in the plasma processing chamber;

stabilizing the chamber pressure in response to the first pressure set point;

forming a plasma in the plasma processing chamber;

applying a process pressure set point to the automatic pressure control system;

stabilizing the chamber pressure in response to the process pressure set point, the first pressure set point being less than the process pressure set point so that the time required to stabilize the chamber pressure in response to the process pressure set point is less than the time required would be if the first pressure set point were equal to the process pressure set point; and Etching said layer with said plasma.

2. The method of claim 1 wherein said first pressure set point is lower than said process pressure set point by about 100 mTorr.

3. The method of claim 1 wherein said process pressure set point is about 500 mTorr.

4. The method of claim 1 wherein said layer is a layer of nitride, said etchant source gas comprises $CF_4$ and $O_2$, and said etching is performed at a chamber pressure of about 400 mTorr to about 600 mTorr.

5. The method of claim 4 wherein said etching is performed at a $CF_4$ to $O_2$ flow ratio of about 9:1.

6. The method of claim 5 wherein said plasma processing chamber contains a top electrode and a bottom electrode, the bottom electrode being spaced apart from the top electrode by a gap, said substrate being disposed on the bottom electrode, and wherein said etching is performed at a chamber pressure of about 500 mTorr, a top RF power of about 300 Watts and a bottom electrode temperature of about 40° C.

7. The method of claim 4 Wherein said nitride is $Si_3N_4$.

* * * * *